(12) United States Patent
Midya et al.

(10) Patent No.: US 7,142,597 B2
(45) Date of Patent: Nov. 28, 2006

(54) FULL BRIDGE INTEGRAL NOISE SHAPING FOR QUANTIZATION OF PULSE WIDTH MODULATION SIGNALS

(75) Inventors: Pallab Midya, Palatine, IL (US); William J. Roeckner, Carpentersville, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 795 days.

(21) Appl. No.: 10/255,213

(22) Filed: Sep. 26, 2002

(65) Prior Publication Data

US 2004/0062303 A1    Apr. 1, 2004

(51) Int. Cl.
*H03K 7/08* (2006.01)
(52) U.S. Cl. .................. 375/238; 375/243; 375/244; 375/245
(58) Field of Classification Search .......... 375/238, 375/242, 243, 244, 245, 254, 285, 316, 346; 330/10, 207, 251; 327/31, 36, 52, 56, 89, 327/274; 332/109
See application file for complete search history.

(56) References Cited

U.S. PATENT DOCUMENTS

| | | | | |
|---|---|---|---|---|
| 4,633,425 | A * | 12/1986 | Senderowicz | 708/819 |
| 5,012,244 | A * | 4/1991 | Wellard et al. | 341/143 |
| 5,559,467 | A * | 9/1996 | Smedley | 330/10 |
| 6,023,143 | A * | 2/2000 | Salina et al. | 318/599 |
| 6,107,876 | A * | 8/2000 | O'Brien | 330/10 |
| 6,169,765 | B1 * | 1/2001 | Holcombe | 375/238 |
| 6,369,730 | B1 * | 4/2002 | Blanken et al. | 341/143 |
| 6,414,613 | B1 | 7/2002 | Midya et al. | 341/143 |
| 6,466,087 | B1 * | 10/2002 | Ruha | 330/10 |
| 6,594,309 | B1 * | 7/2003 | Botti et al. | 375/238 |
| 6,683,494 | B1 * | 1/2004 | Stanley | 330/10 |
| 6,741,123 | B1 * | 5/2004 | Andersen et al. | 330/10 |
| 6,922,100 | B1 * | 7/2005 | Midya et al. | 330/10 |
| 6,933,871 | B1 * | 8/2005 | Melanson et al. | 341/143 |
| 2006/0072657 | A1 * | 4/2006 | Putzeys | 375/238 |

OTHER PUBLICATIONS

Floros et al., "A novel and efficient pcm to pwm converter for digital audio amplifiers," *IEEE*, 165-168, 1999.

* cited by examiner

*Primary Examiner*—Pankaj Kumar
*Assistant Examiner*—Naheed Ejaz
(74) *Attorney, Agent, or Firm*—Fulbright & Jaworski LLP (57) ABSTRACT

Systems and methods are described for full bridge integral noise shaping for quantization of pulse width modulated signals. A method for full bridge integral noise shaping comprises: receiving a first and a second reference PWM signal; summing the first and second reference PWM signals with a quantization error correction; quantizing the sum into a first and a second output PWM signal; differentially integrating the first and second reference PWM signals and the first and second output PWM signals according to a full bridge integral noise shaping algorithm to obtain the quantization error correction. An apparatus for performing a full bridge integral noise shaping quantization of a pulse modulated signal, includes: a single-ended to differential conversion circuit; and a full bridge INS quantizer circuit, coupled to the single-ended to differential conversion circuit.

19 Claims, 10 Drawing Sheets

FULL BRIDGE INTEGRAL NOISE SHAPING FOR QUANTIZATION OF PULSE WIDTH MODULATION SIGNALS

BACKGROUND OF THE INVENTION

1. Field of the Invention

The invention relates generally to the field of digital amplifiers. More particularly, the invention relates to the processing of pulse modulated signals.

2. Discussion of the Related Art

Traditionally, audio amplifiers have operated in the analog domain. These amplifiers tend to have low power conversion efficiency, and consequently have large size and weight. With the advent of digital technology, particularly digital audio sources, audio amplification began being performed in the digital domain.

Digital audio amplifiers using pulse width modulation (PWM) have a higher power conversion efficiency than analog amplifiers, and have a fixed switched frequency. Unlike analog PWM, which quantizes using an analog ramp signal, or the like, digital PWM is quantized and generated by counting cycles of a high speed clock.

U.S. Pat. No. 6,414,613 to Midya, the disclosure of which is hereby expressly incorporated by reference, describes an integral noise shaping (INS) algorithm to quantize PWM waveforms. PWM noise shaping loops are used to improve the in-band signal-to-noise ratio (SNR) of quantized PWM signals by forcing the noise produced from quantizing a duty ratio signal to fall out of the frequency band of interest.

Pulse width modulation based switching amplifiers are often used in full bridge applications with four switches. In such applications, single-sided PWM processing can be utilized and the resulting signal then inverted to create the pair of signals necessary to drive the full bridge power stage. U.S. Pat. No. 6,414,613 is one such example.

To obtain high signal-to-noise ratio using the prior art, there are critical requirements for crystal reference clock frequency, output filtering, matching in the power stage, and matching in the signal path.

SUMMARY OF THE INVENTION

There is a need for the following embodiments. Of course, the invention is not limited to these embodiments.

According to an aspect of the invention, a method for full bridge integral noise shaping comprises: receiving a first and a second reference PWM signal; summing the first and second reference PWM signals with a quantization error correction; quantizing the sum into a first and a second output PWM signal; differentially integrating the first and second reference PWM signals and the first and second output PWM signals according to a full bridge integral noise shaping algorithm to obtain the quantization error correction. According to another aspect of the invention, an apparatus for performing a full bridge integral noise shaping quantization of a pulse modulated signal, includes: a single-ended to differential conversion circuit; and a full bridge INS quantizer circuit, coupled to the single-ended to differential conversion circuit.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numerals (if they occur in more than one view) designate the same elements. The invention may be better understood by reference to one or more of these drawings in combination with the description presented herein. It should be noted that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. It should be understood that the detailed description and the specific examples, while indicating specific embodiments of the invention, are given by way of illustration only and not by way of limitation. Various substitutions, modifications, additions and/or rearrangements within the spirit and/or scope of the underlying inventive concept will become apparent to one of ordinary skill in the art from this disclosure.

Figure 1:
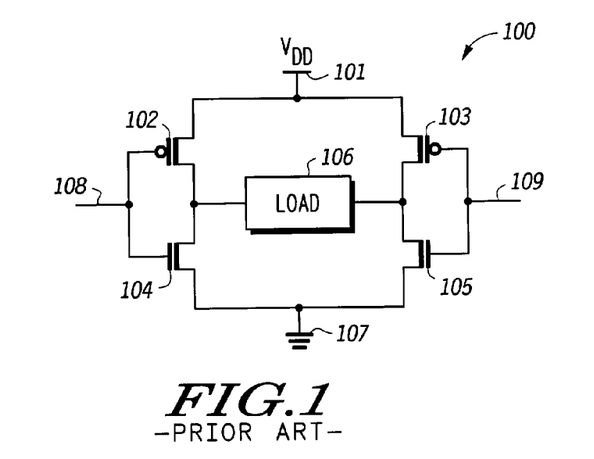
FIG. 1 is a circuit diagram of a full bridge power stage of an amplifier.

Referring to FIG. 1, a circuit diagram of a prior-art full bridge power stage 100 amplifier is depicted. A set of four switches 102–105, comprising p-channel and n-channel field effect transistors (FET) is coupled to a supply voltage 101, a load 106, and a reference voltage (ground) 107. An input 108 is coupled to a first side of the full bridge power stage 100, and another input 109 is coupled to a second side of the full bridge power stage 100. The operation and characteristics of the full bridge power stage 100 and its variations are well known in the art.

Pulse modulation based switching amplifiers are often used in full bridge applications with four switches. Different types of pulse modulated driving signals can be used, such as pulse width modulated (PWM) signals and pulse density modulated signals (PDM). Although the following description refers to PWM driving signals, one of ordinary skill in the art will recognize that the invention also applies to other types of pulse modulated signals.

Typically, PWM processing includes quantization and noise shaping. In the prior art, this processing is done based on a single-sided or halfbridge application. In a typical full bridge application, single-sided PWM processing is utilized and the resulting signal is then inverted, thereby creating the two differential driving signals necessary to drive the pair of inputs to the full bridge power stage.

Figure 2:
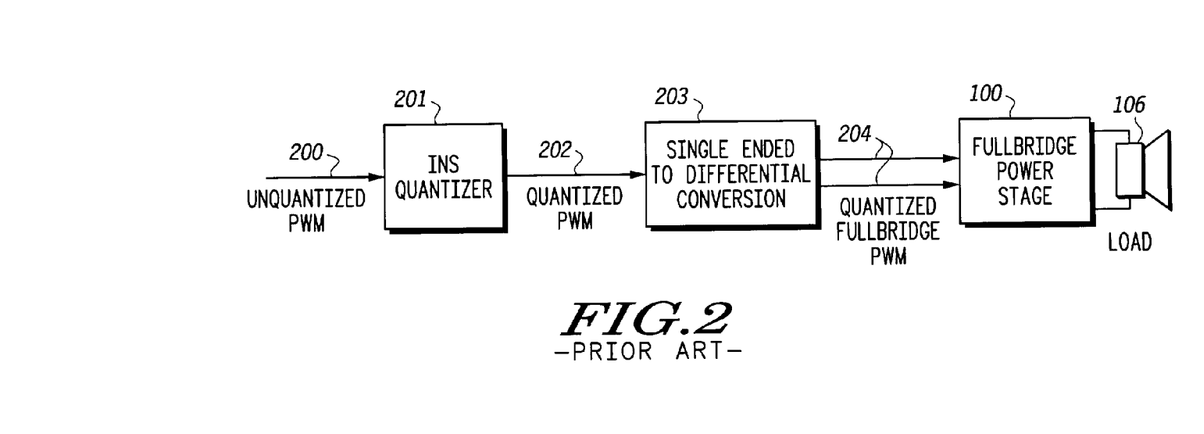
FIG. 2 is a block diagram of a PWM processing scheme.

Referring to FIG. 2, a block diagram of a prior art PWM processing scheme is depicted. An unquantized PWM signal 200 is processed by an integral noise shaping (INS) quantizer 201, yielding a quantized PWM signal 202. The quantized PWM signal 202 is further processed by a single-ended to differential conversion block 203, outputting a pair of differential quantized full bridge PWM signals 204, which can together drive the full bridge power stage 100 coupled to the load 106.

Still referring to FIG. 2, the INS quantizer 201 includes PWM noise shaping loops which are used to improve the in-band signal-to-noise ratio of quantized PWM signals. The input to the loop is a high resolution digital signal which represents a series of duty ratios. The output of the loop is a lower resolution digital signal representing a similar series of duty ratios. A noise shaping loop can force the noise (error) produced from quantizing the duty ratio signal to remain outside of the spectrum of interest. Noise shaping can provide a data directed adjustment to the quantized output sample based on a previously accumulated quantization error.

Figure 3:
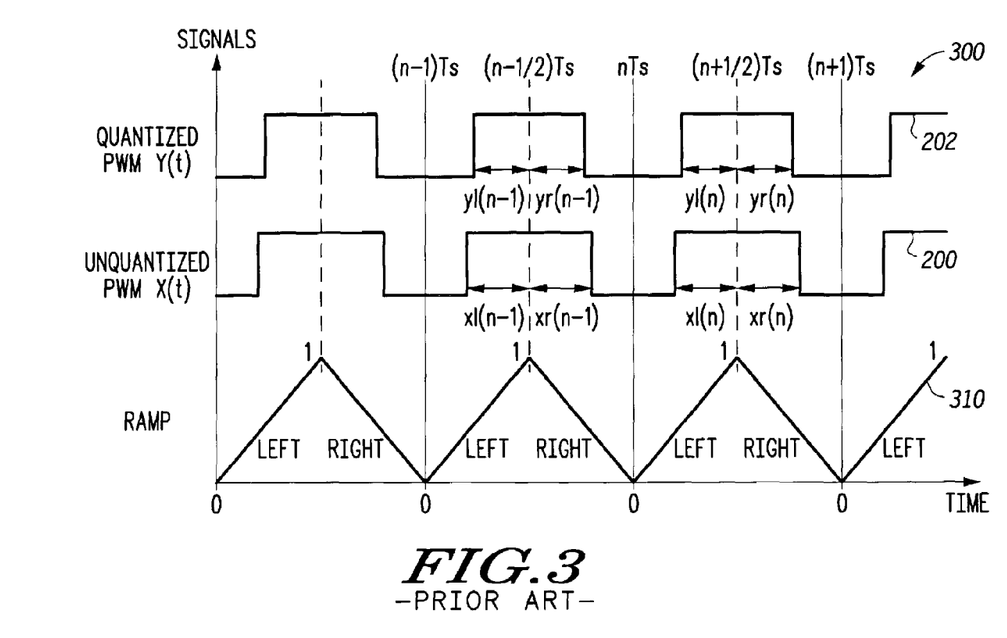
FIG. 3 is a timing diagram of a PWM INS quantization process.

Referring to FIG. 3, a timing diagram 300 of a prior art PWM INS quantization process is depicted. The unquantized PWM signal X(t) 200 is integral noise shaped by the INS quantizer 201 detailed in FIG. 2, yielding the quantized PWM signal Y(t) 202. A reference to a double-sided ramp sampling signal 310 used within a natural sampling circuitry (not shown) is also made. The vertical axis represents the signals 200 and 202, while the horizontal axis represents time. Times of interest include: (n−1)Ts, (n−1/2)Ts, nTs, (n+1/2)Ts, and (n+1)Ts, where Ts is a switching period and n is an integer.

Still referring to FIG. 3, an INS algorithm can compute an integral feedback of the noise between quantized Y(t) 202 and unquantized X(t) 200 PWM signals. An integral term is used to shape the quantization noise. It is possible to integrate PWM waveforms analytically to any order and to quantize rising and falling edges of PWM using the same integral loop. For example, a fourth order system can be used to integrate the error between input X(t) 200 and output Y(t) 202. The integrals are:

$$I_1(t) = \int_{-\infty}^{t} (X(\tau) - Y(\tau)) d\tau \qquad \text{Equ. 1}$$

$$I_2(t) = \int_{-\infty}^{t} (I_1(\tau)) d\tau \qquad \text{Equ. 2}$$

$$I_3(t) = \int_{-\infty}^{t} (I_2(\tau)) d\tau \qquad \text{Equ. 3}$$

$$I_4(t) = \int_{-\infty}^{t} (I_3(\tau)) d\tau \qquad \text{Equ. 4}$$

Equations 1–4 compute the first through fourth order integrals of the error due to quantization of the PWM signal, which can be split into a left half-cycle (l) and a right half-cycle (r). Still referring to FIG. 3, the integrals ($I_1$, $I_2$, $I_3$, and $I_4$) are defined at discrete time intervals and may be computed analytically. The values for the left half-cycle are:

$$il_1(n) = I_1(nT_v) = ir_1(n-1) + ((1-yr(n-1))-(1-xr(n-1))) \qquad \text{Equ. 5}$$

$$\begin{aligned} il_2(n) &= I_2(nT_s) \\ &= ir_2(n-1) + ir_1(n-1) + \\ &\quad \frac{((1-yr(n-1))^2 - (1-xr(n-1))^2)}{2} \end{aligned} \qquad \text{Equ. 6}$$

$$\begin{aligned} il_3(n) &= I_3(nT_s) \\ &= ir_3(n-1) + ir_2(n-1) + \frac{ir_1(n-1)}{2} + \\ &\quad \frac{((1-yr(n-1))^3 - (1-xr(n-1))^3)}{6} \end{aligned} \qquad \text{Equ. 7}$$

$$\begin{aligned} il_4(n) &= I_4(nT_s) \\ &= ir_4(n-1) + ir_3(n-1) + \frac{ir_2(n-1)}{2} + \\ &\quad \frac{ir_1(n-1)}{6} + \frac{((1-yr(n-1))^4 - (1-xr(n-1))^4)}{24} \end{aligned} \qquad \text{Equ. 8}$$

And values for the right half-cycle are:

$$ir_1(n) = I_1\left(\left(n + \frac{1}{2}\right)T_s\right) = il_1(n) + ((xl(n)) - yl(n)) \qquad \text{Equ. 9}$$

-continued $$ir_2(n) = I_2\left(\left(n+\frac{1}{2}\right)T_s\right)$$ Equ. 10

$$= il_2(n) + il_1(n) + \frac{((xl(n))^2 - yl(n))^2)}{2}$$

$$ir_3(n) = I_3\left(\left(n+\frac{1}{2}\right)T_s\right)$$ Equ. 11

$$= il_3(n) + il_2(n) + \frac{il_1(n)}{2} + \frac{((xl(n))^3 - yl(n))^3)}{6}$$

$$ir_4(n) = I_4\left(\left(n+\frac{1}{2}\right)T_s\right)$$ Equ. 12

$$= il_4(n) + il_3(n) + \frac{il_2(n)}{2} + \frac{il_1(n)}{6} + \frac{((xl(n))^4 - yl(n))^4)}{24}$$

Equations 5–8 compute the first through fourth order integrals of the error due to quantization for the left half-cycle of the PWM signal. Equations 9–12 compute the first through fourth order integrals of the error due to quantization for the right half-cycle of the PWM signal. These integral equations, in closed form, allow the computation to be performed at the switching frequency.

The corrected duty ratio is defined for the left and right half-cycles (zl(n) and zr(n), respectively) as follows:

$$zl(n)=xl(n)+k_1il_1(n)+k_2il_2(n)+k_3il_3(n)+k_4il_4(n)$$ Equ. 13

$$zr(n)=xr(n)+k_1ir_1(n)+k_2ir_2(n)+k_3ir_3(n)+k_4il_4(n)$$ Equ. 14 where the K values correspond to weighting factors of the multiple integrators of noise shaping filters.

The corrected duty cycle is quantized to fit an integral number of clock cycles. This results in a quantization error e, which is fed back to the INS loops as the error for future cycles:

$$yl(n)=\text{Quantize}(zl(n))=Q(zl(n))=zl(n)+el(n)$$ Equ. 15

$$yr(n)=\text{Quantize}(zr(n))=Q(zr(n))=zr(n)+er(n)$$ Equ. 16

The present invention includes a method and/or apparatus for full bridge integral noise shaping (INS) for quantization of PWM. In one embodiment, the invention includes a family of INS algorithms that quantize PWM signals to produce two distinct PWM waveforms. As one of ordinary skill in the art will recognize in light of this disclosure, full bridge PWM processing may improve signal-to-noise ratio (SNR) and reduce the requirements for the crystal reference clock frequency, output LC filtering, matching in the power stage, and matching in the reference path. It may also allow a lower switching frequency.

Figure 4:
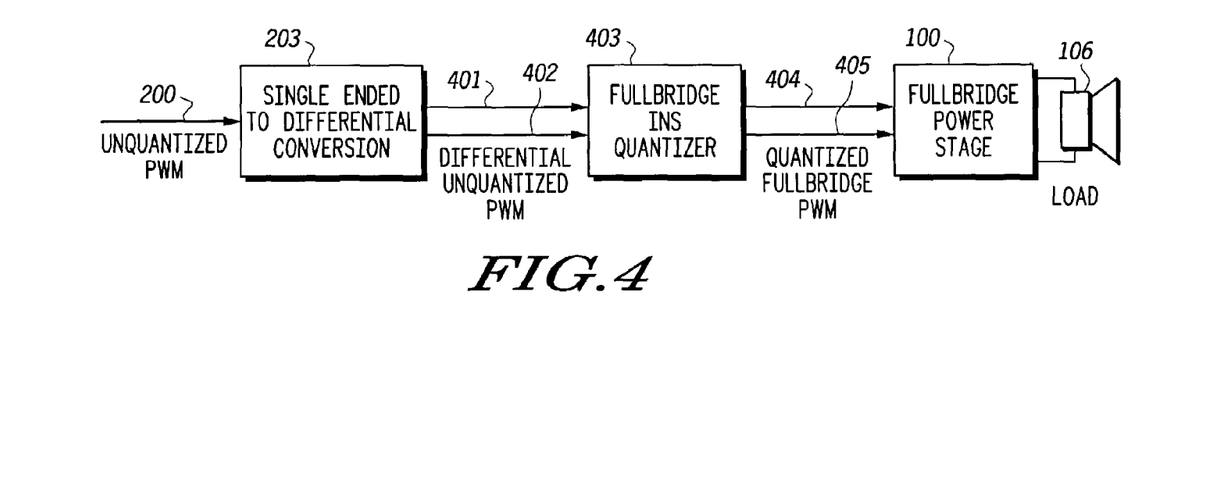
FIG. 4 is a block diagram of a full bridge INS quantization scheme, representing an embodiment of the invention.

Referring to FIG. 4, a block diagram of a full bridge INS quantization scheme is depicted according to one embodiment of the invention. The unquantized signal 200 is processed by the single-ended to differential conversion block 203, yielding a first and a second reference (differential unquantized) PWM signal 401 and 402. The single-ended to differential conversion block 203 may also suppress a carrier signal if one is present in unquantized signal 200. The pair of reference signals 401 and 402 is further processed by a full bridge INS quantizer block 403, yielding a first and a second quantized full bridge PWM signal 404 and 405, which may drive the full bridge power stage 100 coupled to the load 106.

Still referring to FIG. 4, each of the pair of reference signals 401 and 402 may be quantized by a distinct INS operation, resulting in the pair of distinct quantized full bridge PWM signals 404 and 405. According to one aspect of the invention, the pair of PWM signals provide additional switching edges which provide additional samples, and thus the opportunity to increase performance. In one embodiment, the invention provides a pair of distinct quantized full bridge PWM signals 404 and 405 which have complementary duty ratios. In another embodiment, the invention provides a method and apparatus for performing an INS operation at least twice each switching period.

Figure 5:
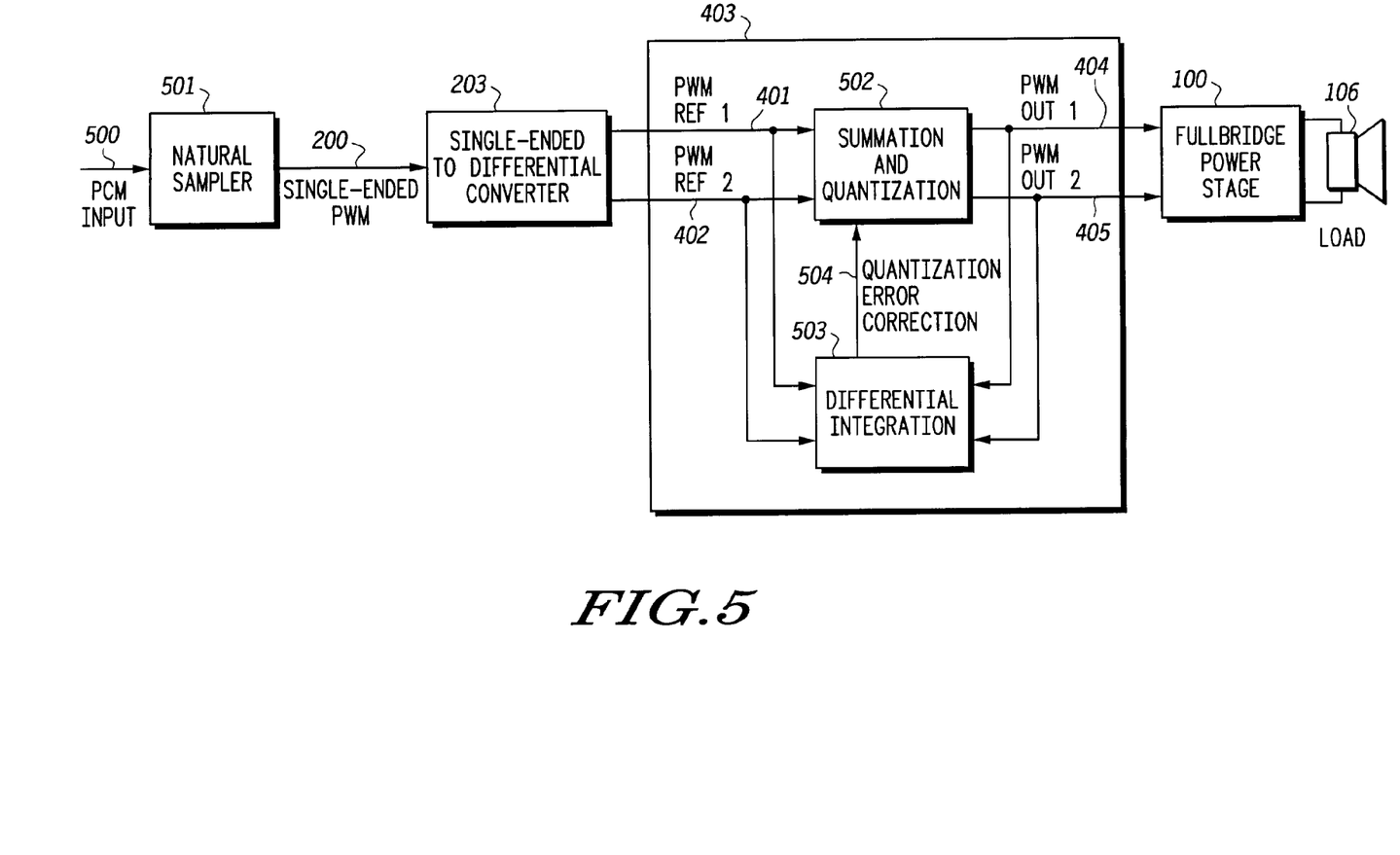
FIG. 5 is a detailed block diagram of a full bridge INS quantization scheme, representing an embodiment of the invention.

Referring to FIG. 5, a more detailed block diagram of a full bridge INS quantization scheme is depicted. A pulse code modulated (PCM) signal 500 is input into a natural sampler 501, which outputs the single-ended PWM signal 200. The single-ended PWM signal 200 is processed by the single-ended to differential converter 203 yielding the first reference PWM signal 401 and the second reference PWM signal 402. The single-ended to differential converter 203 may also suppress a carrier if necessary. The pair of reference PWM signals 401 and 402 is further processed by a summation and quantization block 502 of the full bridge INS quantizer 403, resulting in the first output PWM signal 404 and the second output PWM signal 405. The pair of output PWM signals 404 and 405 may be used to drive the first and second sides of a full bridge power stage 100. A differential integration block 503 of the full bridge INS quantizer 403 receives the pair of reference PWM signals 401 and 402 and the pair of output PWM signals 404 and 405, calculates a quantization error correction 504, and feeds it to the summation and quantization block 502.

Still referring to FIG. 5, the differential integration block 503 may perform independent differential integration operations utilizing the first and second reference PWM signals 401 and 402, and the first and second output PWM signals 404 and 405. The differential integration block 503 may also calculate quantization error correction values 504, which are added to the first and second reference PWM signals 401 and 402 by the summation and quantization block 502 to reduce quantization noise.

In general, in accordance with the present invention, two output PWM signals 404 and 405 are produced as a function of two reference PWM signals 401 and 402 through the operation of summation and quantization block 502 and differential integration block 503 using quantization error correction 504 through an algorithm referred to herein as a full bridge integral noise shaping algorithm. Specific examples of the full bridge integral noise shaping algorithm are presented below with reference to examples 1–4.

EXAMPLES

Specific embodiments of the invention will now be further described by the following, nonlimiting examples which will serve to illustrate in some detail various features. The following examples are included to facilitate an understanding of ways in which the invention may be practiced. It should be appreciated that the examples which follow represent embodiments discovered to function well in the practice of the invention, and thus can be considered to constitute preferred modes for the practice of the invention. However, it should be appreciated that many changes can be made in the exemplary embodiments which are disclosed while still obtaining like or similar result without departing from the spirit and scope of the invention. Accordingly, the examples should not be construed as limiting the scope of the invention.

Example 1

Vector Full Bridge INS

In this embodiment, a vector full bridge INS algorithm produces a first and second output PWM signals which are allowed to be completely different from each other. Each output full bridge PWM signal may drive one side of the full bridge power stage 100 detailed in FIG. 1, i.e., independent duty ratios can be applied to each half of the full bridge power stage 100.

Figure 6:
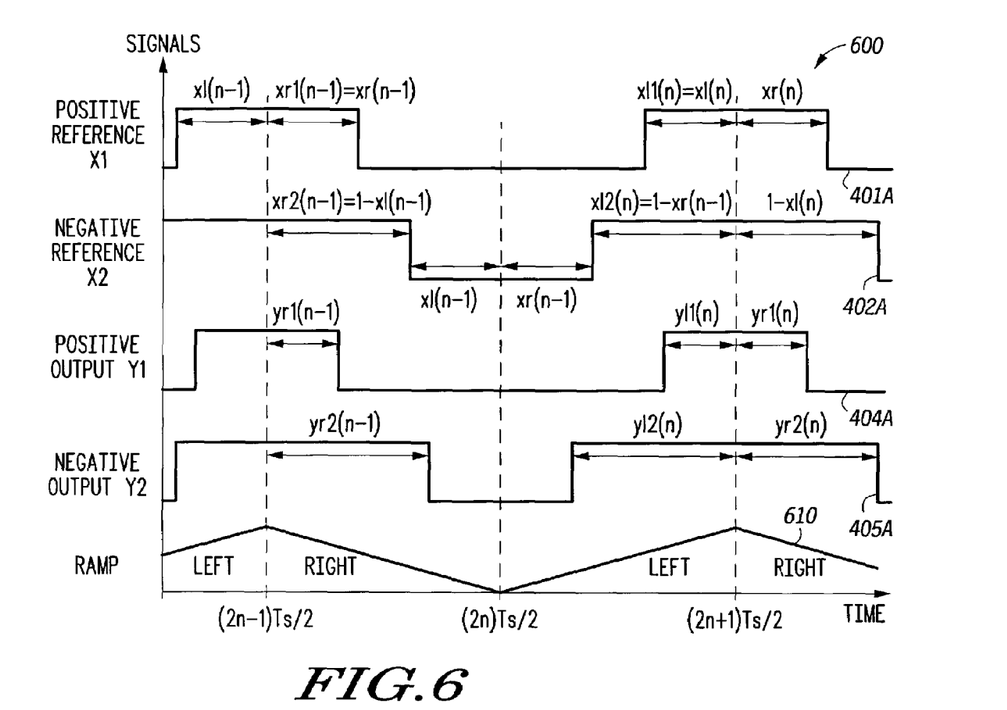
FIG. 6 is a timing diagram of a vector full bridge INS process, representing an embodiment of the invention.

Referring to FIG. 6, a timing diagram of a vector full bridge INS process 600 is depicted. The vertical axis represents the signals 401A, 402A, 404A, and 405A, while the horizontal axis represents time. Times of interest include $(2n-1)Ts/2$, $(2n)Ts/2$, and $(2n+1)Ts/2$, where n is an integer and Ts is the switching period. The pair of reference PWM signals 401A and 402A is applied to the full bridge INS quantizer 403 detailed in FIG. 4, which outputs the pair of output PWM signals 404A and 405A. Note that the negative reference signal 402A is a delayed and inverted version of positive reference signal 401A. A reference to a double-sided ramp sampling signal 610 used within a natural sampling circuitry 501 detailed in FIG. 5 is made. The vector full bridge INS algorithm is as follows:

For right half-cycles (r), at time $t=(2n-1)Ts/2$:

$$xr_1(n-1)=xr(n-1) \quad \text{Equ. 17}$$

$$xr_2(n-1)=1-xl(n-1) \quad \text{Equ. 18}$$

$$z_1=xr_1+k_1I_1+k_2I_2+k_3I_3+k_4I_4 \quad \text{Equ. 19}$$

$$y_1=\text{Quantize}(z_1)=Q(z_1) \quad \text{Equ. 20}$$

$$z_2=xr_2-(k_1I_1+k_2I_2+k_3I_3+k_4I_4)+(y_1-z_1) \quad \text{Equ. 21}$$

$$y_2=\text{Quantize}(z_2)=Q(z_2) \quad \text{Equ. 22}$$

Equations 17 and 18 establish a relationship between right half-cycles of the pair of reference PWM signals 401A and 402A. Equations 19 and 21 define corrected duty ratios for the pair of output PWM signals 404A and 405A as a function of both reference PWM signals 401A and 402A, wherein k values correspond to weighting factors. The operations indicated by equations 19–22 are performed by the differential integration block 503 and the summation and quantization block 502, both detailed in FIG. 5.

Updating the integrals at time $t=(2n)Ts/2$:

$$I_4 = I_4 + I_3 + \frac{I_2}{2} + \frac{I_1}{6} + \frac{(1-y_1)^4}{24} - \frac{(1-xr_1)^4}{24} - \frac{(1-y_2)^4}{24} + \frac{(1-xr_2)^4}{24} \quad \text{Equ. 23}$$

$$I_3 = I_3 + I_2 + \frac{I_1}{2} + \frac{(1-y_1)^3}{6} - \frac{(1-xr_1)^3}{6} - \frac{(1-y_2)^3}{6} + \frac{(1-xr_2)^3}{6} \quad \text{Equ. 24}$$

$$I_2 = I_2 + I_1 + \frac{(1-y_1)^2}{2} - \frac{(1-xr_1)^2}{2} - \frac{(1-y_2)^2}{2} + \frac{(1-xr_2)^2}{2} \quad \text{Equ. 25}$$

$$I_1=I_1+(1-y_1)-(1-xr_1)-(1-y_2)+(1-xr_2) \quad \text{Equ. 26}$$

The integrals depicted in equations 23–26 are performed by the differential integrator 503 detailed in FIG. 5, and provide quantization error correction 504. For left half-cycles (l), at time $t=(2n)Ts/2$:

$$xl_1(n)=xl(n) \quad \text{Equ. 27}$$

$$xl_2(n)=1-xr(n-1) \quad \text{Equ. 28}$$

$$z_1=xl_1+k_1I_1+k_2I_2+k_3I_3+k_4I_4 \quad \text{Equ. 29}$$

$$y_1=\text{Quantize}(z_1)=Q(z_1) \quad \text{Equ. 30}$$

$$z_2=xl_2-(k_1I_1+k_2I_2+k_3I_3+k_4I_4)+(y_1-z_1) \quad \text{Equ. 31}$$

$$y_2=\text{Quantize}(z_2)=Q(z_2) \quad \text{Equ. 32}$$

Equations 27 and 28 establish a relationship between left half-cycles (l) of the pair of reference PWM signals 401A and 402A. Equations 29 and 31 define corrected duty ratios for the pair of output PWM signal 404A and 405A as a function of both reference PWM signals 401A and 402A. Updating the integrals at time $t=(2n+1)Ts/2$:

$$I_4 = I_4 + I_3 + \frac{I_2}{2} + \frac{I_1}{6} - \frac{(xl_2)^4}{24} + \frac{(y_2)^4}{24} + \frac{(xl_1)^4}{24} - \frac{(y_1)^4}{24} \quad \text{Equ. 33}$$

$$I_3 = I_3 + I_2 + \frac{I_1}{2} - \frac{(xl_2)^3}{6} + \frac{(y_2)^3}{6} + \frac{(xl_1)^3}{6} - \frac{(y_1)^3}{6} \quad \text{Equ. 34}$$

$$I_2 = I_2 + I_1 - \frac{(xl_2)^2}{2} + \frac{(y_2)^2}{2} + \frac{(xl_1)^2}{2} - \frac{(y_1)^2}{2} \quad \text{Equ. 35}$$

$$I_1=I_1-xl_2+y_2+xl_1-y_1 \quad \text{Equ. 36}$$

The integrals depicted in equations 33–36 are performed by the differential integrator 503 detailed in FIG. 5, and provide quantization error correction 504.

Figure 7:
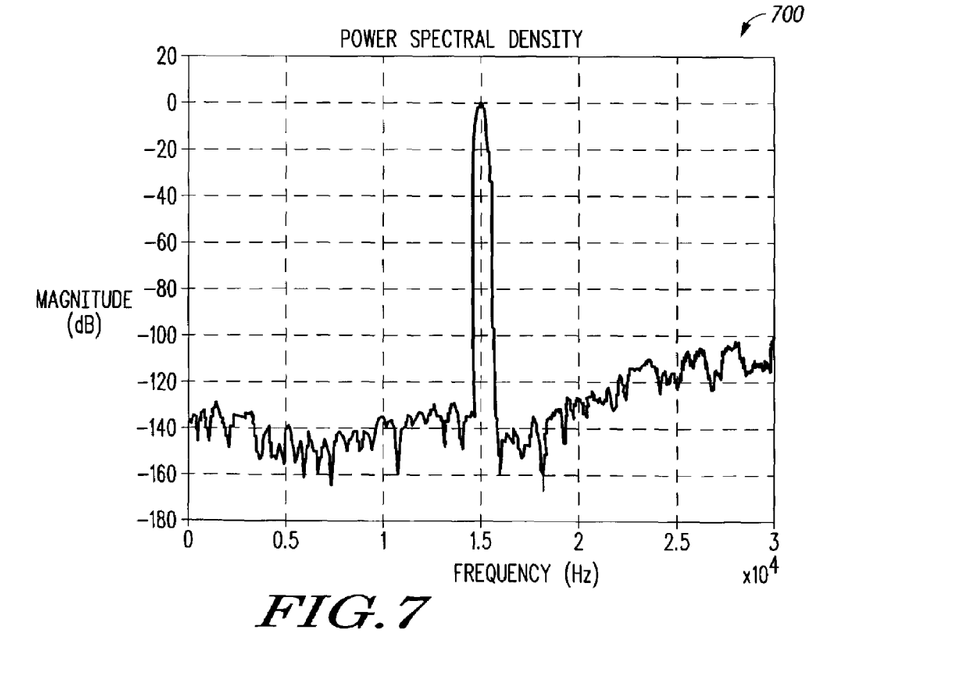
FIG. 7 is a simulated power spectral density graph of a vector full bridge INS output signal, representing an embodiment of the invention.

Referring to FIG. 7, a computer simulated power spectral density graph 700 of a vector full bridge INS output signal is depicted. The input is a 15 kHz full scale tone. Graph 700 is the result of a vector full bridge INS application with no mismatch between the two sides of the power stage 100 as detailed in FIG. 1. The vertical axis represents the magnitude (dB) of the differential signal applied to the load 106, and the horizontal axis represents frequency ($\times 10^4$) of the signal.

Figure 8:
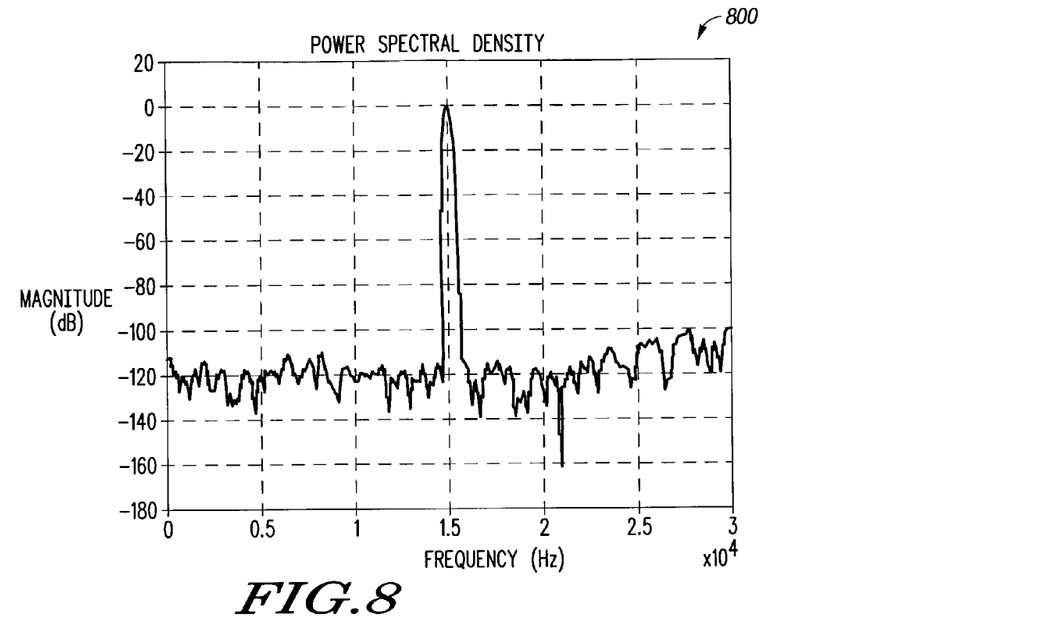
FIG. 8 is a simulated power spectral density graph with 0.3% mismatch of a vector full bridge INS output signal, representing an embodiment of the invention.

Referring to FIG. 8, a computer simulated power spectral density graph with 0.3% mismatch 800 of a vector full bridge INS output signal is depicted. Graph 800 is the result of another vector full bridge INS application, now with 0.3% mismatch between the two sides of the power stage 100, as detailed in FIG. 1. The vertical axis represents the magnitude (dB) of the differential signal applied to the load 106, and the horizontal axis represents frequency ($\times 10^4$ Hz) of the signal. Note that the noise level is significantly elevated compared to that of FIG. 7. A mismatch of 0.3% is representative of what one might find in an integrated power stage. The next example, Complementary Full Bridge INS, describes an alternate embodiment that is more tolerant of power stage mismatch.

Example 2

Complementary Full Bridge INS

In this embodiment, a complementary full bridge INS algorithm produces a first and second output PWM signals which have complementary duty ratios. Each output full bridge PWM signal may drive one side of a full bridge power stage 100 detailed in FIG. 1, i.e., complementary duty ratios can be applied to each half of the full bridge power stage 100.

Figure 9:
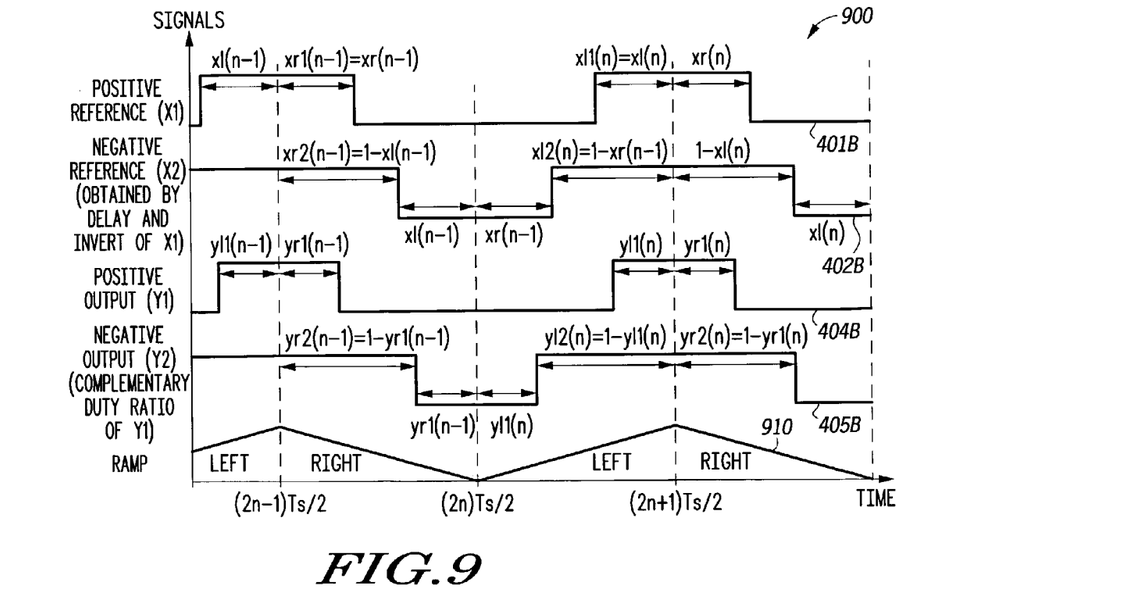
FIG. 9 is a timing diagram of a complementary full bridge INS process, representing an embodiment of the invention.

Referring to FIG. 9, a timing diagram of a complementary full bridge INS process 900 is depicted. The vertical axis represents the signals 401B, 402B, 404B, and 405B, while the horizontal axis represents time. Times of interest include $(2n-1)Ts/2$, $(2n)Ts/2$, and $(2n+1)Ts/2$, where n is an integer and Ts is the switching period. The pair of reference PWM signals 401B, 402B is applied to the full bridge INS quantizer 403 detailed in FIG. 4, which outputs the pair of output PWM signals 404B and 405B. A reference to a double-sided ramp sampling signal 910 used within a natural sampling circuitry 501 detailed in FIG. 5 is made. The complementary full bridge INS algorithm is as follows:

For the right half-cycle (r), at time $t=(2n-1)Ts/2$:

$$xr_1(n-1)=xr(n-1) \quad \text{Equ. 37}$$

$$xr_2(n-1)=1-xl(n-1) \quad \text{Equ. 38}$$

$$z_1 = \frac{xr_1 + (1 - xr_2)}{2} + k_1 I_1 + k_2 I_2 + k_3 I_3 + k_4 I_4 \quad \text{Equ. 39}$$

$$y_1 = \text{Quantize}(z_1) = Q(z_1) \quad \text{Equ. 40}$$

$$y_2 = 1 - y_1 \quad \text{Equ. 41}$$

Equations 37 and 38 establish a relationship between right half-cycles of the pair of reference PWM signals 401B and 402B. Equation 39 defines corrected duty ratio for the output PWM signal 404B as a function of both reference PWM signals 401B and 402B, wherein k values correspond to weighting factors. The operations indicated by equations 39–41 are performed by the differential integration block 503 and the summation and quantization block 502, both detailed in FIG. 5. Updating the integrals at time $t=(2n)Ts/2$:

$$I_4 = I_4 + I_3 + \frac{I_2}{2} + \frac{I_1}{6} + \frac{(1-y_1)^4}{24} - \frac{(1-xr_1)^4}{24} - \frac{(1-y_2)^4}{24} + \frac{(1-xr_2)^4}{24} \quad \text{Equ. 42}$$

$$I_3 = I_3 + I_2 + \frac{I_1}{2} + \frac{(1-y_1)^3}{6} - \frac{(1-xr_1)^3}{6} - \frac{(1-y_2)^3}{6} + \frac{(1-xr_2)^3}{6} \quad \text{Equ. 43}$$

$$I_2 = I_2 + I_1 + \frac{(1-y_1)^2}{2} - \frac{(1-xr_1)^2}{2} - \frac{(1-y_2)^2}{2} + \frac{(1-xr_2)^2}{2} \quad \text{Equ. 44}$$

$$I_1 = I_1 + (1-y_1) - (1-xr_1) - (1-y_2) + (1-xr_2) \quad \text{Equ. 45}$$

The integrals depicted in equations 42–45 are performed by the differential integrator 503 detailed in FIG. 5, and provide quantization error correction 504. For the left half-cycle (l), at time $t=(2n)Ts/2$:

$$xl_1(n)=xl(n) \quad \text{Equ. 46}$$

$$xl_2(n)=1-xr(n-1) \quad \text{Equ. 47}$$

$$z_1 = \frac{xl_1 + (1 - xl_2)}{2} + k_1 I_1 + k_2 I_2 + k_3 I_3 + k_4 I_4 \quad \text{Equ. 48}$$

$$y_1 = Q(z_1) \quad \text{Equ. 49}$$

$$y_2 = 1 - y_1 \quad \text{Equ. 50}$$

Equations 46 and 47 establish a relationship between left half-cycles of the pair of reference PWM signals 401B and 402B. Equation 48 defines corrected duty ratio for the output PWM signal 404B as a function of both reference PWM signals 401B and 402B. Updating the integrals at time $t=(2n+1)TS/2$:

$$I_4 = I_4 + I_3 + \frac{I_2}{2} + \frac{I_1}{6} - \frac{(xl_2)^4}{24} + \frac{(y_2)^4}{24} + \frac{(xl_1)^4}{24} - \frac{(y_1)^4}{24} \quad \text{Equ. 51}$$

$$I_3 = I_3 + I_2 + \frac{I_1}{2} - \frac{(xl_2)^3}{6} + \frac{(y_2)^3}{6} + \frac{(xl_1)^3}{6} - \frac{(y_1)^3}{6} \quad \text{Equ. 52}$$

$$I_2 = I_2 + I_1 - \frac{(xl_2)^2}{2} + \frac{(y_2)^2}{2} + \frac{(xl_1)^2}{2} - \frac{(y_1)^2}{2} \quad \text{Equ. 53}$$

$$I_1 = I_1 - xl_2 + y_2 + xl_1 - y_1 \quad \text{Equ. 54}$$

The integrals depicted in equations 51–54 are performed by the differential integrator 503 detailed in FIG. 5, and provide quantization error correction 504.

Figure 10:
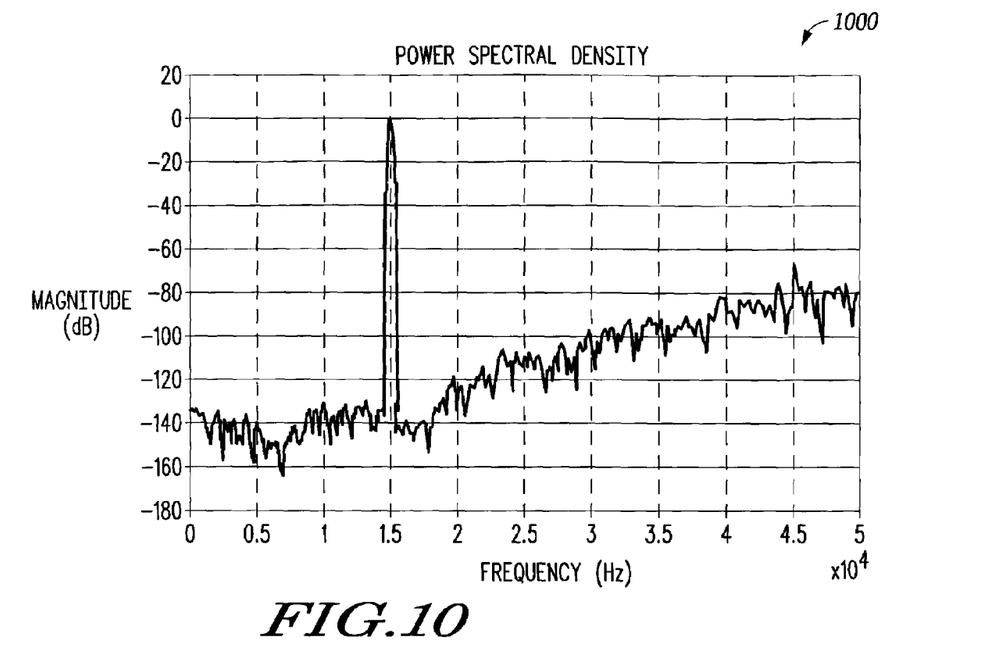
FIG. 10 is a simulated power spectral density graph of a complementary full bridge INS output signal, representing an embodiment of the invention.
Figure 11:
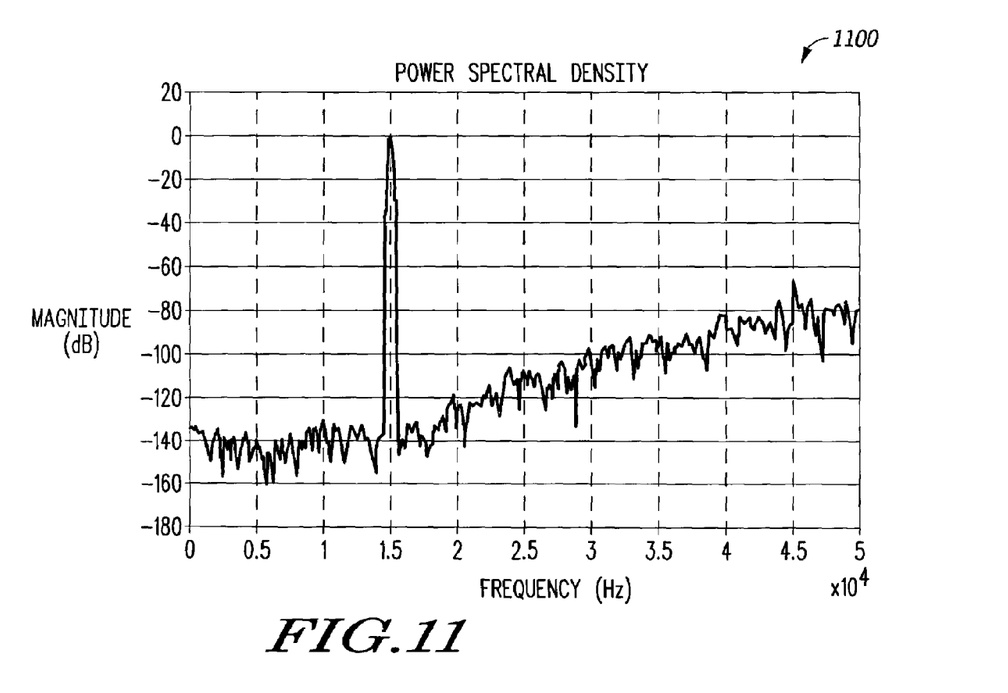
FIG. 11 is a simulated power spectral density graph with 0.3% mismatch of a complementary full bridge INS output signal, representing an embodiment of the invention.
Figure 12:
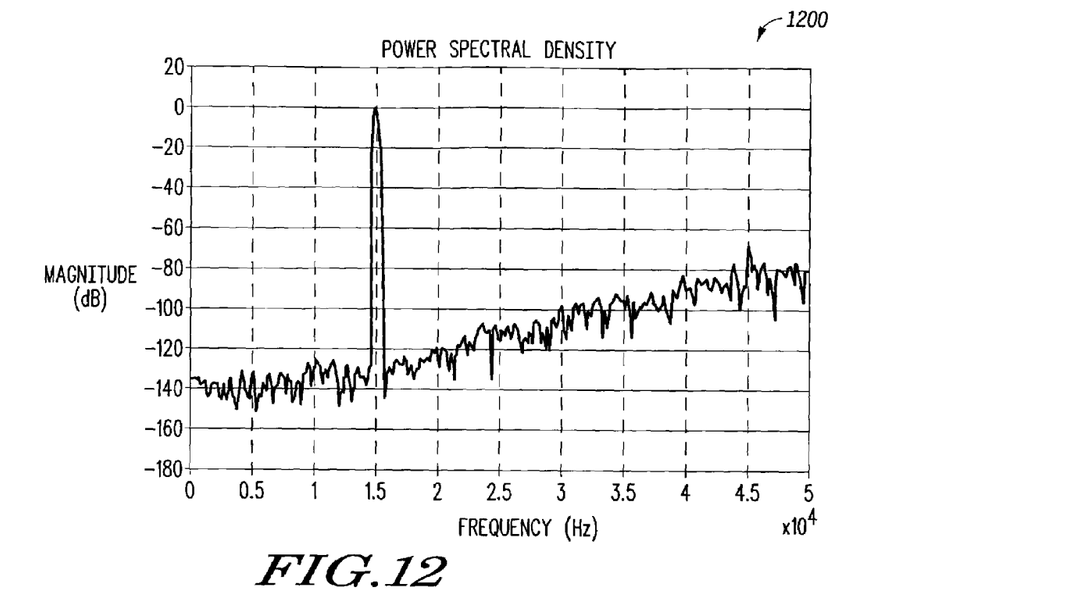
FIG. 12 is a simulated power spectral density graph with 1% mismatch of a complementary full bridge INS output signal, representing an embodiment of the invention.

Referring to FIGS. 10–12, computer simulated power spectral density graphs 1000, 1100, and 1200 of complementary full bridge INS output signals are depicted. In each graph, the vertical axis represents the magnitude (dB) of the differential signal applied to the load 106 detailed in FIG. 1, and the horizontal axis represents frequency ($\times 10^4$ Hz) of such signal. Graph 1000 refers to a complementary full bridge INS application with no mismatch between the two sides of the power stage. Graph 1100 refers to a complementary full bridge INS application with 0.3% mismatch between the two sides of the power stage. Note that the degradation in signal-to-noise due to 0.3% mismatch is not significant. Graph 1200 refers to a complementary full bridge INS application with 1% mismatch between the two sides of the power stage. In this case the signal-to-noise ratio degradation due to mismatch is increased, but the result may still be acceptable for many applications.

Example 3

Shifted Full Bridge INS, Sampling at Twice the Switching Frequency

In this embodiment, a shifted full bridge INS algorithm sampling at twice the switching frequency produces a first and second output PWM signals. Each output full bridge PWM signal may have an independent duty ratio, and each can drive one side of a full bridge power stage 100 detailed in FIG. 1.

Figure 13:
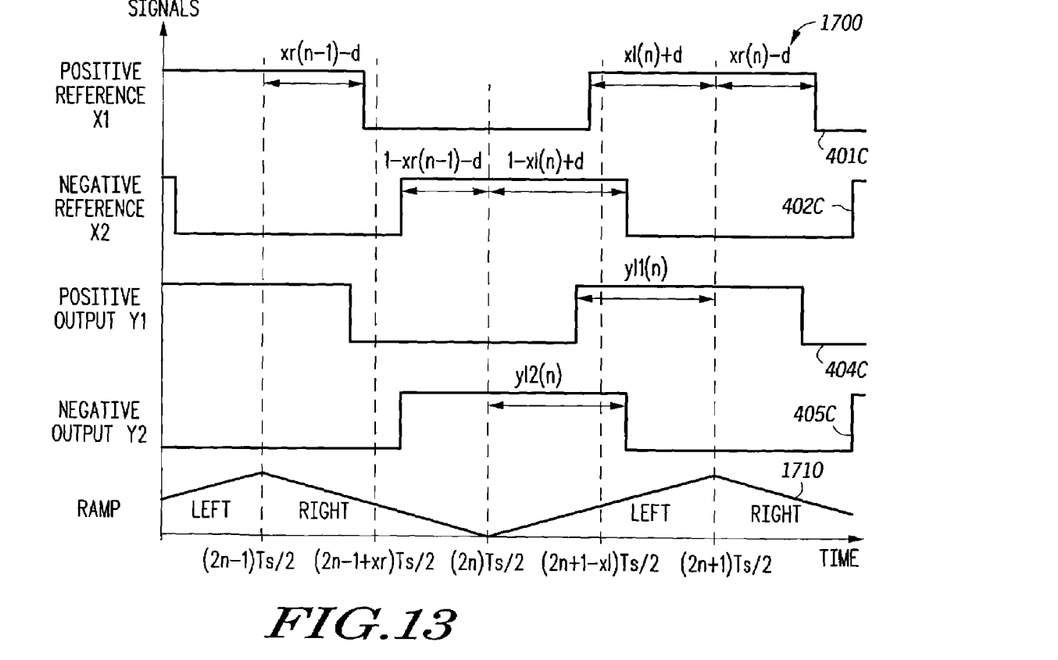
FIG. 13 is a timing diagram of a shifted reference full bridge INS process operating at twice the switching frequency, representing an embodiment of the invention.

Referring to FIG. 13, a timing diagram of a shifted full bridge INS process 1700 is depicted. The vertical axis represents the signals 401C, 402C, 404C, and 405C, while the horizontal axis represents time. Times of interest include (2n−1)Ts/2, (2n−1+xr)Ts/2, (2n)Ts/2, (2n+1−xl)Ts/2, and (2n+1)Ts/2; where n is an integer and Ts is the switching period. The first reference PWM signal 401C is advanced by dTs/2 relative to the single-ended PWM signal 200, and the second reference PWM signal 402C is delayed by dTs/2 relative to the single-ended PWM signal 200, where d is a constant. Note that, at the times of interest, PWM signals 404C and 405C will not go through a switching transition for all possible inputs. Within each switching period Ts there exists four such times. In the previous examples there are only two such times in a switching period Ts. The pair of reference PWM signals 401C and 402C is applied to the full bridge INS quantizer 403 detailed in FIG. 4, which outputs the pair of output PWM signals 404C and 405C. Reference to a double-sided ramp sampling signal 1710 used within a natural sampling circuitry 501 detailed in FIG. 5 is made. The shifted full bridge INS algorithm sampling at twice the switching frequency is as follows:

For the right half-cycle, at time t=(2n−1)Ts/2:

$$xr_1 = xr - d \quad \text{Equ. 55}$$

$$xr_2 = 1 - xr - d \quad \text{Equ. 56}$$

$$z_1 = xr_1 + k_1 I_1 + k_2 I_2 + k_3 I_3 + k_4 I_4 \quad \text{Equ. 57}$$

$$y_1 = Q(z_1) \quad \text{Equ. 58}$$

$$y_2 = 1 - 2d - y_1 \quad \text{Equ. 59}$$

Equations 55 and 56 establish a relationship between right half-cycles of the pair of reference PWM signals 401C and 402C. Equation 57 defines corrected duty ratio for the output PWM signal 404C as a function of one of the pair of reference PWM signals 401C and 402C, wherein k values correspond to weighting factors. The operations indicated by equations 57–59 are performed by the differential integration block 503 and the summation and quantization block 502, both detailed in FIG. 5. Updating the integrals at time t=(2n)Ts/2:

$$I_4 = I_4 + I_3 + I_2/2 + I_1/6 + (1-y_1)^3/24 - (1-xr_1)^3/24 + (y_2)^3/24 - (xr_2)^3/24 \quad \text{Equ. 60}$$

$$I_3 = I_3 + I_2 + I_1/2 + (1-y_1)^3/6 - (1-xr_1)^3/6 + (y_2)^3/6 - (xr_2)^3/6 \quad \text{Equ. 61}$$

$$I_2 = I_2 + I_1 + (1-y_1)^2/2 - (1-xr_1)^2/2 + (y_2)^2/2 - (xr_2)^2/2 \quad \text{Equ. 62}$$

$$I_1 = I_1 + (1-y_1) - (1-xr_1) + y_2 - xr_2 \quad \text{Equ. 63}$$

The integrals depicted in equations 60–63 are performed by the differential integrator 503 detailed in FIG. 5 and provide quantization error correction 504. For the left half-cycle, at time t=(2n)Ts/2:

$$xl_1 = xl + d \quad \text{Equ. 64}$$

$$xl_2 = 1 - x + d \quad \text{Equ. 65}$$

$$z_1 = xl_1 + k_1 I_1 + k_2 I_2 + k_3 I_3 + k_4 I_4 \quad \text{Equ. 66}$$

$$y_1 = Q(z_1) \quad \text{Equ. 67}$$

$$y_2 = 1 + 2d - y_1 \quad \text{Equ. 68}$$

Equations 64 and 65 establish a relationship between left half-cycles of the pair of reference PWM signals 401C and 402C. Equation 66 defines corrected duty ratio for the output PWM signal 404C as a function of one of the pair of reference PWM signals 401C and 402C. Updating the integrals at time t=(2n+1)Ts/2:

$$I_4 = I_4 + I_3 + \frac{I_2}{2} + \frac{I_1}{6} + \frac{(1-xl_2)^4}{24} - \frac{(1-y_2)^4}{24} + \frac{(xl_1)^4}{24} - \frac{(y_1)^4}{24} \quad \text{Equ. 69}$$

$$I_3 = I_3 + I_2 + \frac{I_1}{2} + \frac{(1-xl_2)^3}{6} - \frac{(1-y_2)^3}{6} + \frac{(xl_1)^3}{6} - \frac{(y_1)^3}{6} \quad \text{Equ. 70}$$

$$I_2 = I_2 + I_1 + \frac{(1-xl_2)^2}{2} - \frac{(1-y_2)^2}{2} + \frac{(xl_1)^2}{2} - \frac{(y_1)^2}{2} \quad \text{Equ. 71}$$

$$I_1 = I_1 + (1-xl_2) - (1-y_2) + xl_1 - y_1 \quad \text{Equ. 72}$$

The integrals depicted in equations 69–72 are performed by the differential integrator 503 detailed in FIG. 5 and provide quantization and error correction 504.

Figure 14:
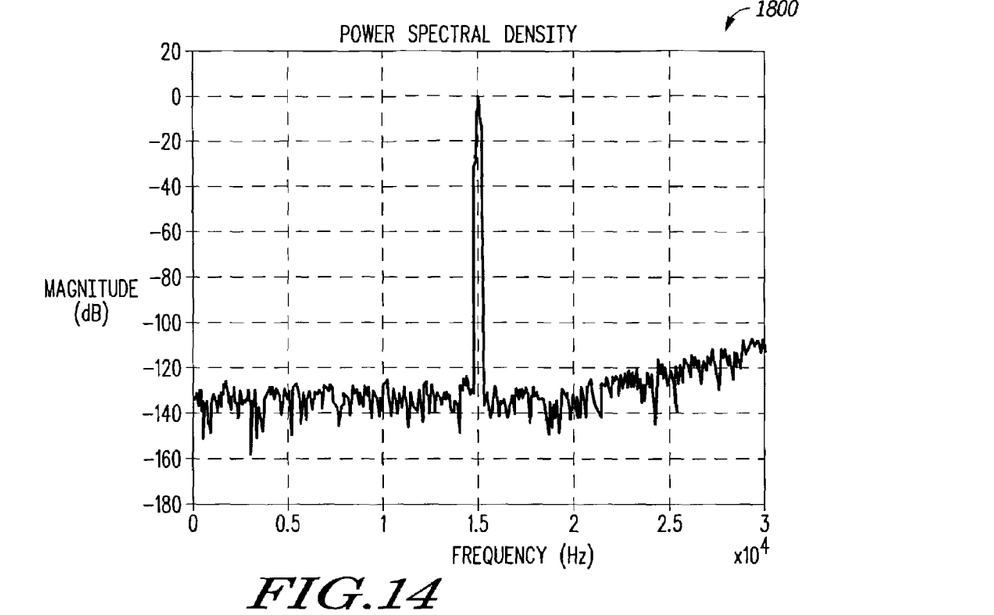
FIG. 14 is a simulated power spectral density graph of a shifted reference full bridge INS output signal operating at twice the switching frequency, representing an embodiment of the invention.

Referring to FIG. 14, a simulated power spectral density graph 1800 of a shifted reference full bridge INS signal at twice the switching frequency is depicted. The vertical axis represents the magnitude (dB) of the differential signal applied to the load 106 detailed in FIG. 1, and the horizontal axis represents frequency ($\times 10^4$ Hz) of the signal. Note that the noise floor of graph 1800 is somewhat elevated compared to that of graph 1000 in FIG. 10. However, there are applications that can benefit from the fact that in every switching period Ts there are four time intervals during which the PWM output signals 404C and 405C are not transitioning.

Example 4

Shifted Full Bridge INS, Sampling at Four Times the Switching Frequency

In this embodiment, a shifted full bridge INS algorithm sampling at four times the switching frequency produces a first and second output PWM signals. Each output full bridge PWM signal has a completely independent duty ratio, and each may drive one side of a full bridge power stage 100 detailed in FIG. 1.

Figure 15:
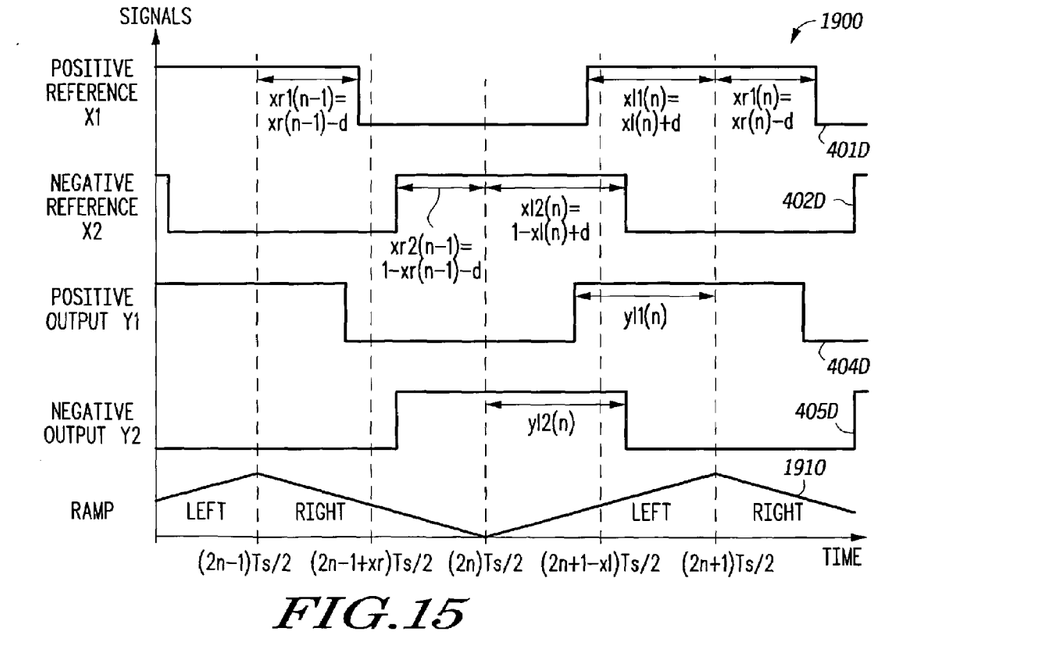
FIG. 15 is a timing diagram of a shifted reference full bridge INS process operating at four times the switching frequency, representing an embodiment of the invention.

Referring to FIG. 15, a timing diagram of a shifted full bridge INS process 1900 is depicted. The vertical axis represents the signals 401D, 402D, 404D, and 405D, while the horizontal axis represents time. Times of interest include (2n−1)Ts/2, (2n−1+xr)Ts/2, (2n)Ts/2, (2n+1−xl)Ts/2, and (2n+1)Ts/2; where n is an integer and Ts is the switching period. The first reference PWM signal 401D is advanced by dTs/2 relative to the single-ended PWM signal 200, and the second reference PWM signal 402D is delayed by dTs/2 relative to the single-ended PWM signal 200, where d is a constant. The pair of reference PWM signals 401D and 402D is applied to the full bridge INS quantizer 403 detailed in FIG. 4, which outputs the pair of output PWM signals 404D and 405D. Reference to a double-sided ramp sampling signal 1910 used within a natural sampling circuitry 501 detailed in FIG. 5 is made. A third-order shifted full bridge INS algorithm sampling at four times the switching frequency is as follows:

At time $t=(2n-1)Ts/2$:

$$xr_1 = xr-d \qquad \text{Equ. 73}$$

$$z_1 = xr_1 + k_1 I_1 + k_2 I_2 + k_3 I_3 \qquad \text{Equ. 74}$$

$$y_1 = Q(z_1) \qquad \text{Equ. 75}$$

Updating the integrals at time $t=(2n-1+xr)Ts/2$:

$$I_3 = I_3 + I_2(xr) + I_1 \frac{(xr)^2}{2} + \frac{(xr-y_1)^3}{6} - \frac{(xr-xr_1)^3}{6} \qquad \text{Equ. 76}$$

$$I_2 = I_2 + I_1(xr) + \frac{(xr-y_1)^2}{2} - \frac{(xr-xr_1)^2}{2} \qquad \text{Equ. 77}$$

$$I_1 = I_1 + (xr-y_1) - (xr-xr_1) \qquad \text{Equ. 78}$$

At time $t=(2n-1+xr)Ts/2$:

$$xr_2 = 1-xr-d \qquad \text{Equ. 79}$$

$$z_2 = xr_2 - (k_1 I_1 + k_2 I_2 + k_3 I_3) \qquad \text{Equ. 80}$$

$$y_2 = Q(z_2) \qquad \text{Equ. 81}$$

Updating the integrals at time $t=(2n)Ts/2$:

$$I_3 = I_3 + I_2(1-xr) + I_1 \frac{(1-xr)^2}{2} + \frac{(y_2)^3}{6} - \frac{(xr_2)^3}{6} \qquad \text{Equ. 82}$$

$$I_2 = I_2 + I_1(1-xr) + \frac{(y_2)^2}{2} - \frac{(xr_2)^2}{2} \qquad \text{Equ. 83}$$

$$I_1 = I_1 + y_2 - xr_2 \qquad \text{Equ. 84}$$

At time $t=(2n)Ts/2$:

$$xl_1 = xl+d \qquad \text{Equ. 85}$$

$$z_1 = xl_1 + k_1 I_1 + k_2 I_2 + k_3 I_3 \qquad \text{Equ. 86}$$

$$y_1 = Q(z_1) \qquad \text{Equ. 87}$$

Updating the integrals at time $t=(2n+1-xl)Ts/2$:

$$I_3 = I_3 + I_2(1-xl) + I_1 \frac{(1-xl)^2}{2} + \frac{(xl_1-xl)^3}{6} - \frac{(y_1-xl)^3}{6} \qquad \text{Equ. 88}$$

$$I_2 = I_2 + I_1(1-xl) + \frac{(xl_1-xl)^2}{2} - \frac{(y_1-xl)^2}{2} \qquad \text{Equ. 89}$$

$$I_1 = I_1 + (xl_1-xl) - (y_1-xl) \qquad \text{Equ. 90}$$

At time $t=(2n+1-xl)Ts/2$:

$$xl_2 = 1xl+d \qquad \text{Equ. 91}$$

$$z_2 = zl_2 - (k_1 I_1 + k_2 I_2 + k_3 I_3) \qquad \text{Equ. 92}$$

$$y_2 = Q(z_2) \qquad \text{Equ. 93}$$

Updating the integrals at time $t=(2n+1)Ts/2$:

$$I_3 = I_3 + I_2(xl) + I_1 \frac{(xl)^2}{2} + \frac{(1-xl_2)^3}{6} - \frac{(1-y_2)^3}{6} \qquad \text{Equ. 94}$$

$$I_2 = I_2 + I_1(xl) + \frac{(1-xl_2)^2}{2} - \frac{(1-y_2)^2}{2} \qquad \text{Equ. 95}$$

$$I_1 = I_1 + (1-xl_2) - (1-y_2) \qquad \text{Equ. 96}$$

Figure 16:
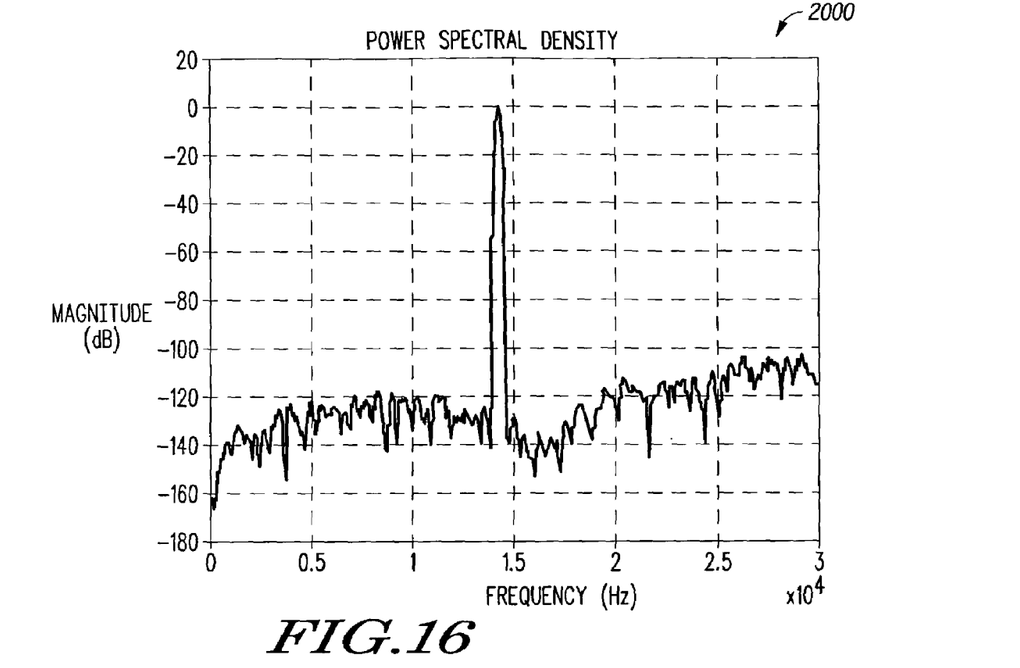
FIG. 16 is a simulated power spectral density graph of a shifted reference full bridge INS output signal operating at four times the switching frequency, representing an embodiment of the invention.

Equations 74, 80, 86, and 92 define corrected duty ratio for the output PWM signal 404D, wherein k values correspond to weighting factors. The operations indicated by equations 73–75, 79–81, 85–87, and 91–93 are performed by the differential integration block 503 and the summation and quantization block 502, both detailed in FIG. 5. The integrals depicted in equations 76–78, 82–84, 88–90, and 94–96 are performed by the differential integrator 503, also detailed in FIG. 5 and provide quantization and error correction 504. Referring Referring to FIG. 16, a simulated power spectral density graph 2000 of a third-order shifted reference full bridge INS signal at four times the switching frequency is depicted. Note that for the third-order example illustrated in FIG. 16, the noise spectrum has nulls at dc and 16 kHz. The input is a full scale tone at 14 kHz. By sampling at four times the switching frequency, this algorithm allows one to lower the switching frequency without degrading performance.

Figure 17:
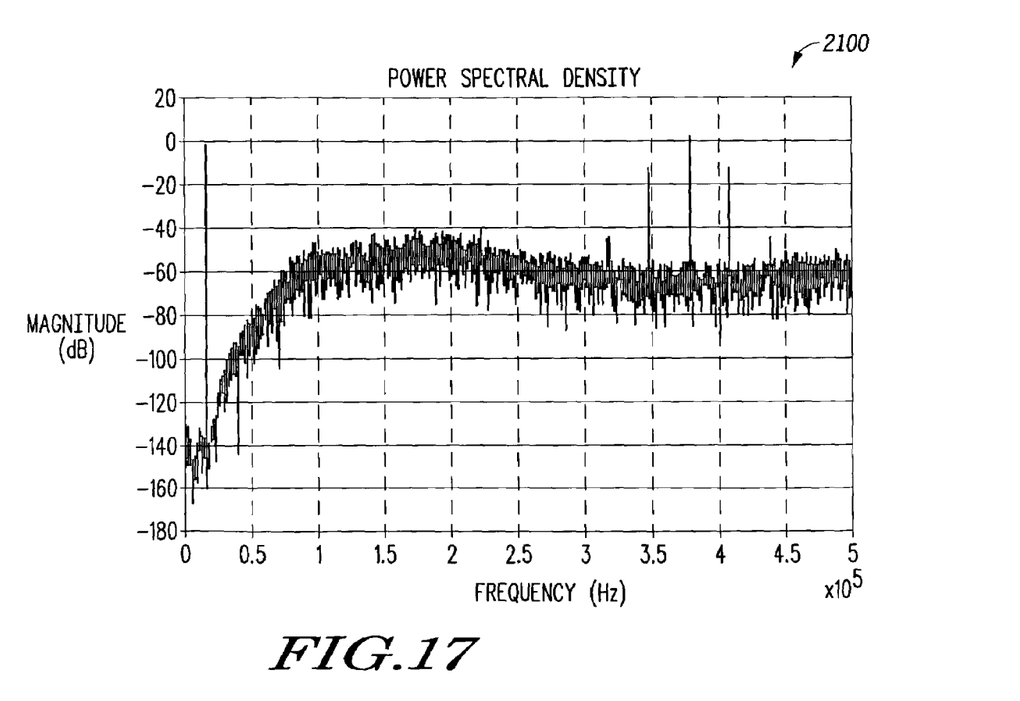
FIG. 17 is a simulated output spectrum graph of a single-ended INS output signal.
Figure 18:
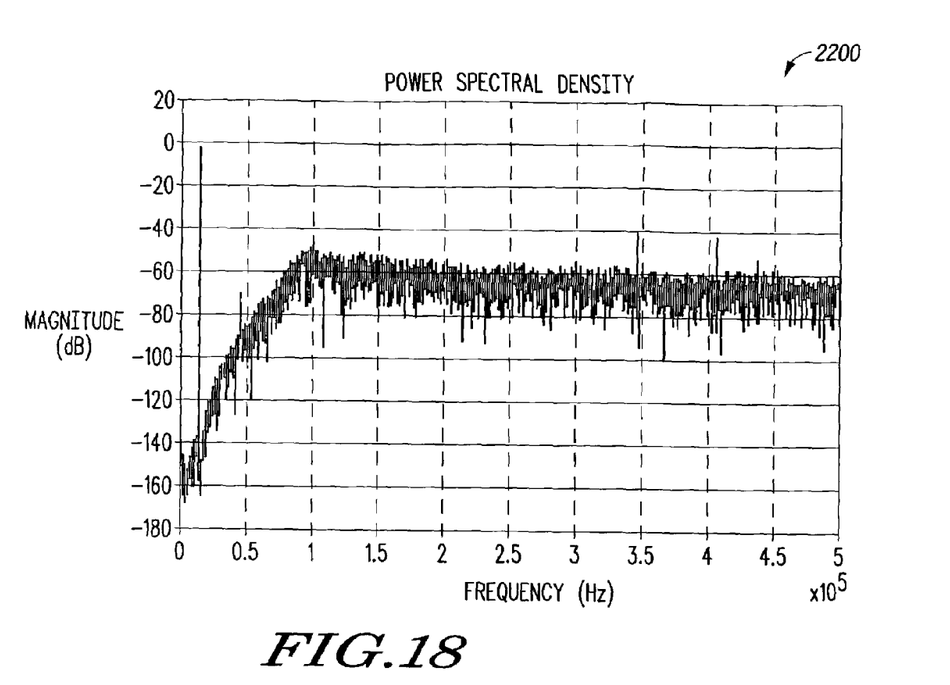
FIG. 18 is a simulated output spectrum graph of a full bridge INS output signal, representing an embodiment of the invention.

Referring to FIG. 17, a simulated output spectrum graph of a prior-art single-ended INS output signal 2100 is depicted. This simulation corresponds to the block diagram detailed in FIG. 2. Referring to FIG. 18, a simulated output spectrum graph of a full bridge INS output signal 2200 according to one aspect of the invention is depicted. This simulation corresponds to the block diagram detailed in FIG. 4, utilizing a Complementary Full Bridge INS algorithm of fourth order such as the one detailed in example 2.

Referring to FIGS. 17 and 18, the vertical axis shows the magnitude of the output signal in dB and the horizontal axis shows the frequency of the signal up to 500 kHz. The passband is from dc to 20 kHz and the noise has been minimized in this region. The signal is a full scale signal at 15 kHz. The switching frequency is 375 kHz.

Still referring to FIGS. 17 and 18, the full bridge INS output signal 2200 was obtained under the same conditions as the prior-art single-ended INS output signal 2100, but the full scale tone at the switching frequency has been suppressed. This improvement over the prior art allows reducing the requirements for a passive L-C low pass filter, which is usually utilized between the power stage and the load.

The invention includes a method and/or apparatus for full bridge integral noise shaping for quantization of PWM signals. The invention includes a plurality of algorithms for performing full bridge integral noise shaping operations. As one of ordinary skill in the art will recognize in light of this disclosure, the methods contained herein may be implemented via hardware (for example, via an application specific integrated circuit), or via software.

Certain embodiments of the invention allow the sample rate to be at least doubled, thus allowing higher performance and/or lower switching frequency. One of ordinary skill in the art will recognize in light of this disclosure that the invention includes applications ranging from non-audio amplifiers to motion control.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The term program or software, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system. The phrase any integer derivable therein, as used herein, is defined as an integer between the corresponding numbers recited in the specification, and the phrase any range derivable therein is defined as any range within such corresponding numbers.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

What is claimed is:

1. A method for full bridge integral noise shaping, comprising:
   receiving a first and a second reference PWM signal;
   summing at least one of the first and second reference PWM signals with a quantization error correction to obtain a sum;
   quantizing the sum to produce a first and a second output PWM signal; and
   differentially integrating the first and second reference PWM signals and the first and second output PWM signals according to a full bridge integral noise shaping algorithm to obtain the quantization error correction.

2. The method of claim 1, wherein the full bridge integral noise shaping algorithm includes a vector full bridge integral noise shaping algorithm.

3. The method of claim 1, wherein the full bridge integral noise shaping algorithm includes a complementary full bridge integral noise shaping algorithm.

4. The method of claim 1, wherein the full bridge integral noise shaping algorithm includes a shifted reference full bridge integral noise shaping algorithm.

5. A method for processing a PWM signal, comprising:
   receiving a single-ended PWM signal;
   differentially converting the single-ended PWM signal into a first reference PWM signal and a second reference PWM signal;
   summing at least one of the first and second reference PWM signals with a quantization error correction to obtain a sum;
   quantizing the sum to produce a first and a second output PWM signal; and
   differentially integrating the first and second reference PWM signals and the first and second output PWM signals according to a full bridge integral noise shaping algorithm to obtain the quantization error correction.

6. The method of claim 5, wherein full bridge integral noise shaping includes performing a vector full bridge integral noise shaping algorithm.

7. The method of claim 5, wherein full bridge integral noise shaping includes performing a complementary full bridge integral noise shaping algorithm.

8. The method of claim 5, wherein full bridge integral noise shaping includes performing a shifted reference full bridge integral noise shaping algorithm.

9. The method of claim 5, further comprising suppressing a carrier of the single-ended PWM signal.

10. The method of claim 5, further comprising applying the first output PWM signal to a first side of a full bridge power stage.

11. The method of claim 5, further comprising applying the second output PWM signal to a second side of a full bridge power stage.

12. A method for driving a full bridge power stage, comprising:
    receiving first and second pulse modulated signals;
    summing at least one of the first and second pulse modulated sianals with a quantization error correction to obtain a sum;
    quantizing the sum to produce a first quantized pulse modulated signal and a second quantized pulse modulated signal;
    differentially integratina the first and second pulse modulated signals and the first and second quantized pulse modulated signals to obtain the quantization error correction;
    driving a first side of the full bridge power stage with said first quantized pulse modulated signal; and
    driving a second side of the full bridge power stage with said second quantized pulse modulated signal.

13. The method of claim 12, wherein the first and second pulse modulated signals are pulse width modulated signals.

14. The method of claim 12, wherein the first and second pulse modulated signals are pulse density modulated signals.

15. The method of claim 12, wherein the first and second pulse modulated signals are different from each other.

16. The method of claim 12, wherein the first and second quantized pulse modulated signals have complementary duty ratios.

17. The method of claim 12, wherein the first and second pulse modulated signals are sampled at least twice as fast as a switching frequency.

18. An apparatus for performing a full bridge integral noise shaping quantization of a pulse modulated signal, including:
    a single-ended to differential conversion circuit for differentially converting a single-ended pulse modulated signal into a first pulse modulated signal and a second pulse modulated signal; and
    a full bridge integral noise shaping quantizer circuit, coupled to the single-ended to differential conversion circuit, comprising:
      a summation and guantization circuit coupled to the conversion circuit for summing at least one of the first and second pulse modulated signals with a quantization error correction to obtain a sum and for Quantizing the sum to produce a first quantized pulse modulated signal a second quantized pulse modulated signal; and
      a differential integration circuit coupled to the summation and quantization circuit for differentially integrating the first and second pulse modulated signals and the first and second quantized pulse modulated signals to obtain the quantization error correction.

19. The apparatus of claim 18, further comprising a full bridge power stage coupled to the full bridge INS quantizer circuit.

* * * * *